United States Patent [19]
Nagano

[11] Patent Number: 4,752,693
[45] Date of Patent: Jun. 21, 1988

[54] CIRCUIT WITH A PHOTO COUPLER

[75] Inventor: Katsumi Nagano, Shimonoseki, Japan

[73] Assignee: Tokyo Shibaura Denki Kabushiki Kaisha, Shimonoseki, Japan

[21] Appl. No.: 900

[22] Filed: Jan. 6, 1987

Related U.S. Application Data

[62] Division of Ser. No. 592,808, Mar. 23, 1984, Pat. No. 4,652,764.

[30] Foreign Application Priority Data

Mar. 31, 1983 [JP] Japan .................................. 58-56053
Apr. 30, 1983 [JP] Japan .................................. 58-76457

[51] Int. Cl.$^4$ ............................................. G02B 27/00
[52] U.S. Cl. ..................................... 250/551; 307/311
[58] Field of Search ............... 250/227, 551, 209, 214; 455/602; 307/311

[56] References Cited

U.S. PATENT DOCUMENTS

| 3,486,029 | 12/1969 | Barrett et al. | 250/551 |
| 3,742,947 | 7/1973 | Hashem | 307/311 |
| 3,772,514 | 11/1973 | Sunderland | 250/551 |
| 4,282,604 | 8/1981 | Jefferson | 250/551 |
| 4,580,293 | 4/1986 | Reichle | 455/618 |
| 4,633,525 | 12/1986 | Eumurian | 455/618 |

FOREIGN PATENT DOCUMENTS 1533072 11/1978 United Kingdom .

OTHER PUBLICATIONS

J. Marcus, "Electronic Circuits Manual", (McGraw-Hill, Inc., 1971), p. 319.
U. Tietze et al., "Halbleiter-Schaltungstechnik", (Springer-Verlag, 1974), pp. 104, 105, 668-673.

Primary Examiner—David C. Nelms
Attorney, Agent, or Firm—Finnegan, Henderson, Farabow, Garrett & Dunner

[57] ABSTRACT

A current source circuit contains a transistor for controlling current flowing into an electric/photo converting element in a control photo coupler so that current flowing into a photo/electric converting element in the control photo coupler is equal to a predetermined ratio of an input current from an input current source. The control photo coupler and an output photo coupler are interconnected so that the current proportional to the current flowing into the electric/photo converting circuit of the control photo coupler is fed into the electric/photo converting circuit of the output photo coupler.

4 Claims, 11 Drawing Sheets

F I G. 5
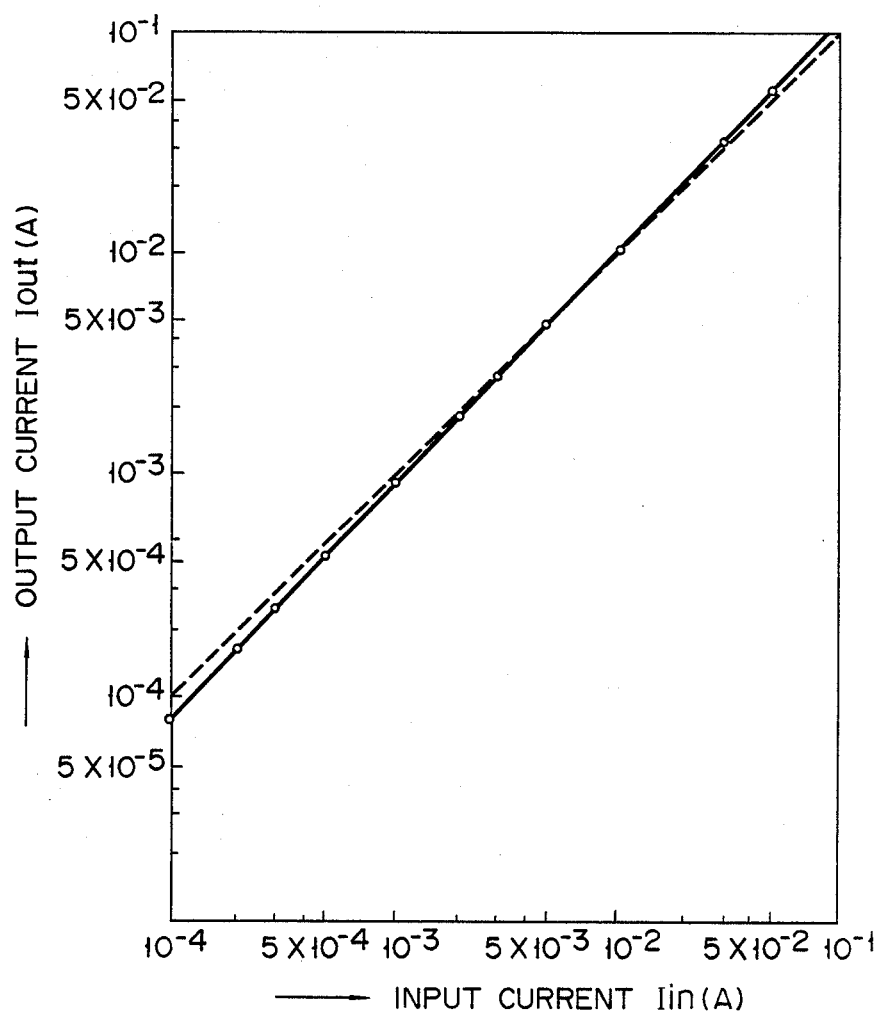

CIRCUIT WITH A PHOTO COUPLER

This is a division of application Ser. No. 592,808, filed Mar. 23, 1984, and issued as U.S. Pat. No. 4,652,764 on Mar. 24, 1987.

BACKGROUND OF THE INVENTION

The present invention relates to a circuit with a photo or optical coupler.

A circuit including a combination of an electric/light converting element and a light/electric converting element is generally called a photo or optical coupler. An equivalent circuit of the photo coupler is shown in FIG. 1A or 1B. In the equivalent circuit shown in FIG. 1A, an input current $I_F$ is converted by a light-emitting diode LD into a corresponding light signal. The light signal is received and converted again into a current signal by a photo diode PD. The converted current signal is amplified by a transistor $Q_A$. An output current Ic fed from the collector/emitter path is used as an output current of the photo coupler. In the equivalent circuit shown in FIG. 1B, an input current $I_F$ is converted by a light-emitting diode LD into a corresponding light signal. The light signal is received by a photo transistor $Q_P$. An output curret Ic of the photo coupler circuit is taken out from the collector/emitter path of the transistor $Q_P$. In this case, the output current Ic is given by the following equation:

$$Ic = K\left(\frac{I_F}{I_F'}\right)^n \quad (1)$$

where K is the factor of proportionality, $I_F'$ is the input current (reference input current) when the factor of proportionality K is measured, and n is the inclination of the $I_F$–Ic characteristic curve when it is logarithmically expressed.

The $I_F$–Ic characteristics of three photo couplers which are commercially available are shown in FIGS. 2A to 2C. In these figures, the abscissa represents an input current $I_F$, and the ordinate represents an output current Ic. As seen from the characteristic curves, the index n is not constant over the entire range of the input current $I_F$; it is approximately "2" in a small current region ($I_F < 5$ mA); in a large current region ($I_F > 10$ mA), n is approximately "1". This fact indicates that the current transfer ratio is nonlinear. A nonlinear current transfer ratio is problematic when the photo coupler circuit is incorporated into a linear circuit, for example, as a current source circuit for gaining an output current exactly corresponding to an input current.

There is known a current source circuit which is designed so as to have an output current proportional to the input voltage. In such a current source circuit, the polarity of the output current with respect to that of the input voltage depends on the type of the current mirror circuit used as an output stage. This implies that the polarity of the output current is determined solely on the type of the current mirror circuit. This greatly restricts the circuit design.

There is further known a voltage/current converting circuit with the above photo coupler designed so as to produce a current corresponding to an input voltage. Because a nonlinear photo coupler is used, the converting circuit can not produce an output current exactly proportional to the input voltage. Also in this converting circuit, the polarity of the output current depends on the current mirror circuit of the output stage. This restricts the design freedom of the circuit, as it does in the current source circuit.

SUMMARY OF THE INVENTION

Accordingly, an object of the present invention is to provide a current source circuit in which there is a linear relationship between the input current and the output current.

Another object of the present invention is to provide a current source circuit which is simple in construction and which can freely select the polarity of the output current.

Another object of the present invention is to provide a voltage/current converting circuit in which there is a linear proportional relationship between the input voltage and the output current.

Yet another object of the present invention is to provide a voltage/current converting circuit which is simple in construction and can freely select the polarity of the output current.

According to the invention, there is provided a current source circuit comprising:

an input current source;

a control photo coupler containing an electric/photo converting circuit and a photo/electric converting circuit;

an output photo coupler containing an electric/photo converting circuit and a photo/electric converting circuit;

a current control circuit for controlling current flowing into the electric/photo converting circuit of said photo couplers so that the current flowing into said photo/electric converting circuit of said control photo coupler becomes equal to a predetermined ratio of the input current from said input current source;

a circuit for connecting both said photo couplers so that current proportional to the current flowing through the electric/photo converting circuit of said control photo coupler is fed to the electric/photo converting circuit of said output photo coupler; and a circuit output current proportional to said input current being taken out said photo/electric converting circuit.

According to the invention, there is further provided a voltage/current converting circuit comprising:

a voltage/current converting section containing a transistor for voltage/current conversion connected at the emitter to a resistor for providing current proportional to an input voltage, said voltage/current converting section producing current proportional to said input voltage;

an electric/photo converting circuit for converting into an optical signal the current provided by said resistor in said voltage/current converting section; and a photo/electric converting circuit for converting said optical signal into a current signal and outputting output current proportional to said current flowing into said resistor.

BRIEF DESCRIPTION OF THE DRAWINGS

FIG. 5 shows an input/output characteristic curve and its ideal curve, which are plotted using data collected from the experimental circuit;

DETAILED DESCRIPTION OF THE PREFERRED EMBODIMENTS

1. First Embodiment of the Current Source Circuit

1.1 Configuration

Figure 3:
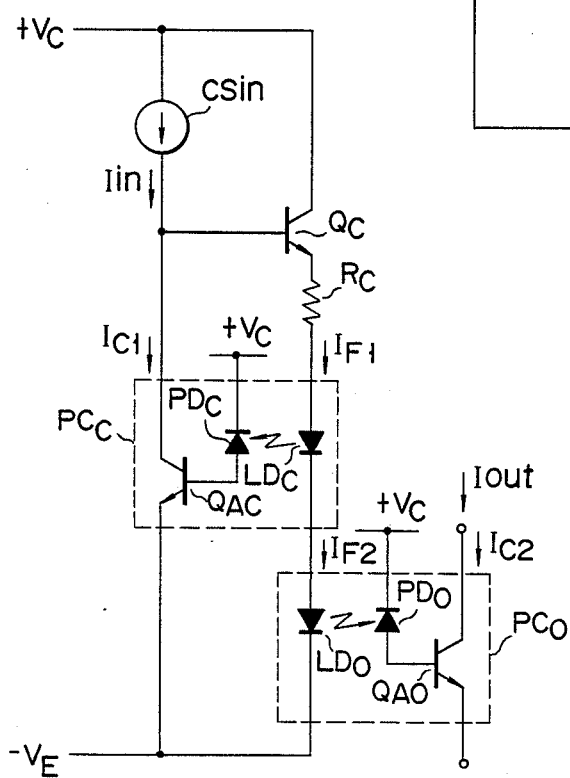
FIG. 3 is a circuit diagram of a current source circuit which is an embodiment according to the present invention.

FIG. 3 illustrates a first embodiment of a current source circuit according to the present invention. In the figure, an NPN transistor $Q_C$ for controlling the current is connected at the collector to a positive power source $+V_C$. A control photo coupler $PC_C$ is composed of a light-emitting diode $LD_C$ as an electric/light converting element, a photo diode $PD_C$ as a light/electric converting element, and an NPN transistor $Q_{AC}$ for current amplification. An output photo coupler $PC_O$ is comprised of a light-emitting diode $LD_O$, a photo diode $PD_O$, and an NPN transistor $Q_{AO}$ for current amplification. The anode of the light-emitting diode $LD_C$ is connected to the emitter of an NPN transistor $Q_C$ through a resistor $R_C$ to prevent an overcurrent. The cathode of the same is connected to a negative power source through the light-emitting diode $LD_O$. The light-emitting diode $LD_O$ is connected at the anode to the cathode of the light-emitting diode $LD_C$, and at the cathode to $-V_E$ potential. An input current source circuit CSin for feeding a constant current Iin is inserted between the power source potential $+V_C$ and the base of the transistor $Q_C$. The NPN transistor $Q_{AC}$ in the control photo coupler $PC_C$ is connected between the base of the NPN transistor $Q_C$ and $-V_E$. The collector of the NPN transistor $Q_{AC}$ is connected to the output of the input current source circuit CSin. The emitter of the same is connected to the $-V_E$ potential. Connected to the base of the NPN transistor $Q_{AC}$ is the anode of the photo diode $PD_C$. The cathode of the photo diode $PD_C$ is connected to the power source potential $+V_C$. The collector/emitter path of the transistor $Q_{AO}$ of the output photo coupler $PC_O$ provides a collector current Ic2 or an output current Iout. The base of the transistor $Q_{AO}$ is connected to the power source $+V_C$ via the photo diode $PD_O$. The anode of the photo diode $PD_O$ is coupled with the base of the transistor $Q_{AD}$, and its collector is connected to $+V_C$.

1.2 Operation

The operation of the current source circuit thus arranged will now be given. Assume now that current flows from the input current source circuit CSin into the base of the transistor $Q_C$, and the NPN transistor $Q_C$ is turned on. Upon turning on the NPN transistor $Q_C$, currents $I_{F1}$ and $I_{F2}$ flow respectively into the light-emitting diodes $LD_C$ and $LD_O$ through the resistor $R_C$, so that these diodes emit light coresponding to the currents $I_{F1}$ and $I_{F2}$, respectively. The photo diode $PD_C$ responds to the light signal from the light-emitting diode $LD_C$, and is conductive. As a result, the NPN transistor $Q_{AC}$ is turned on, and the current Ic1 flows through the collector/emitter path of the NPN transistor $Q_{AC}$. The photo diode $PD_C$ of the output photo coupler $PC_O$ receives a light signal from the light-emitting diode $LD_O$, and is conductive. Then, the transistor $Q_{AO}$ is turned on, and a current Ic2 flows into the collector/emitter path of the transistor $Q_{AO}$. This then is the operation of the current source circuit of FIG. 3. The current Ic2 is taken out as the circuit output current Iout.

In the current source circuit, the input current source circuit CSin, the NPN transistor $Q_C$ and the control photo coupler $PC_C$ constitute a control circuit system to determine the value of the current. In the control circuit system, a feedback loop composed of the NPN transistor $Q_C$ and the control photo coupler $PC_C$ functions so as to make the collector current Ic1 of the NPN transistor $Q_{AC}$ of the control photo coupler $PC_C$ equal to the input current Iin from the input current source circuit CSin. The current $I_{F2}$ flowing into the output photo coupler $PC_O$ is equal to the current $I_{F1}$. Hence, if the characteristics of the photo couplers $PC_C$ and $PC_O$ are equal to each other, the collector current Ic2 of the NPN transistor $Q_{AO}$ of the output photo coupler $PC_O$, i.e. the circuit output current Iout, is equal to the input current Iin from the input current source circuit CSin.

The current values flowing at the respective portions in the current source circuit will qualitatively be described. The currents Ic1 and Ic2 respectively flowing into the photo couplers $PC_C$ and $PC_O$ are expressed by:

$$Ic1 = K1 \left( \frac{I_{F1}}{I_F} \right)^{n1} \quad (2)$$

$$Ic2 = K2 \left( \frac{I_{F2}}{I_F} \right)^{n2} \quad (3)$$

where K1 and K2 are the factors of proportionality, and n1 and n2 are indices. As mentioned above, $I_{F1} = I_{F2}$. Therefore, the equation (3) can be rearranged into the following equation (4):

$$Ic2 = K2 \left( \frac{Ic1}{K1} \right)^{\frac{n2}{n1}} \quad (4)$$

If the base of the NPN transistor $Q_C$ is negligible, the following relations hold:

$Iin = Ic1$ $Iout = Ic2.$

The equation (4) can be rewritten into:

$$Iout = K2 \left( \frac{Iin}{K1} \right)^{\frac{n2}{n1}} \quad (5)$$

If the characteristics of the photo couplers $PC_C$ and $PC_O$ are equal to each other, $n2/n1 = 1$, and $K1 = K2$ Hence, the output current Iout and the input current Iin are equal to each other and can be expressed by:

$Iout = Iin \quad (6)$

An error of the input/output characteristic as given by the equation (5) will be discussed. The index ratio $n2/n1$ is:

$n2/n1 = 1 + (n2 - n1)/n1 \approx 1 + \Delta n$ where, $\Delta n = (n2 - n1)/n1 \ll 1$ By using this index ratio $n2/n1$, the output current Iout can be approximated and is mathematically:

$$\begin{aligned} Iout &\approx K2 \left( \frac{Iin}{K1} \right)^{1+\Delta n} \quad (7)\\ &= K2\, e^{(\ln \frac{Iin}{K1})(1+\Delta n)} \\ &= K2\, e^{\ln \frac{Iin}{K1}} \cdot e^{\ln \frac{Iin}{K1} \Delta n} \\ &= \frac{K2}{K1} Iin \cdot e^{\ln \frac{Iin}{K1} \Delta n} \end{aligned}$$

If the index $\ln \frac{Iin}{K1} \Delta n$ in the above equation is:

$\ln \frac{Iin}{K1} \cdot \Delta n < 1$ the following relation holds:

$$\begin{aligned} e^{\ln \frac{Iin}{K1} \Delta n} &= 1 + \Delta n \ln \frac{Iin}{K1} + \frac{1}{2} \left( \Delta n \ln \frac{Iin}{K1} \right)^2 + \quad (8)\\ &\approx 1 + \Delta n \ln \frac{Iin}{K1} \end{aligned}$$

Substituting the equation (8) into the equation (7), we have the output current Iout as expressed by:

$$Iout \approx \frac{K2}{K1} Iin \left( 1 + \Delta n \ln \frac{Iin}{K1} \right) \quad (9)$$

In the above equation, the factor of proportionality is, $\frac{K2}{K1} = 1 + \frac{K2 - K1}{K1} \approx 1 + \Delta k,$ where, $\Delta k$ is, $\Delta k = \frac{K2 - K1}{K1} < 1,$ Then, we have:

$$Iout \approx (1 + \Delta k) \left( 1 + \Delta n \ln \frac{Iin}{K1} \right) Iin \quad (10)$$

A transfer ratio $\Gamma$ of current is:

$$\begin{aligned} \Gamma &= \frac{Iout}{Iin} \quad (11)\\ &\approx (1 + \Delta k) \left( 1 + \Delta n \ln \frac{Iin}{K1} \right) \\ &\approx 1 + \Delta k \Delta n \ln \frac{Iin}{K1} \end{aligned}$$

The above equation (11) teaches that as the input current Iin becomes smaller, an error of the current transfer ratio $\Gamma$ increases in the negative direction, beginning with 1. To be more specific, in the equation (1), assume that $\Delta k = \Delta n = 0.1$, and $K1 = 1$. On this assumption, the errors $\Delta F$ of the current transfer ratios F for Iin = $10^{-1}$A, $10^{-2}$A, $10^{-3}$A, $10^{-4}$A are respectively $-2.3\%$, $-4.6\%$, $-6.9\%$, $-9.2\%$. Thus, the smaller the input current Iin, the larger the error of the output current Iout.

1.3 Experimental Circuit

Figure 1A:
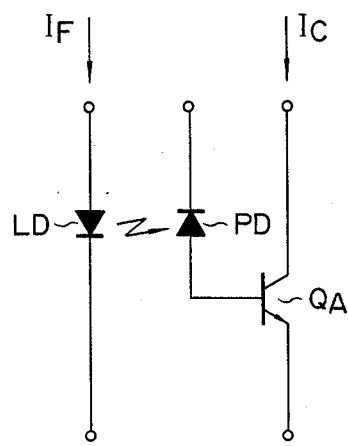
FIGS. 1A and 1B are equivalent circuits of the prior art photo coupler circuits, respectively.
Figure 1B:
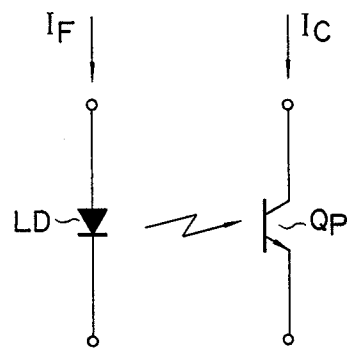
Figure 2A:
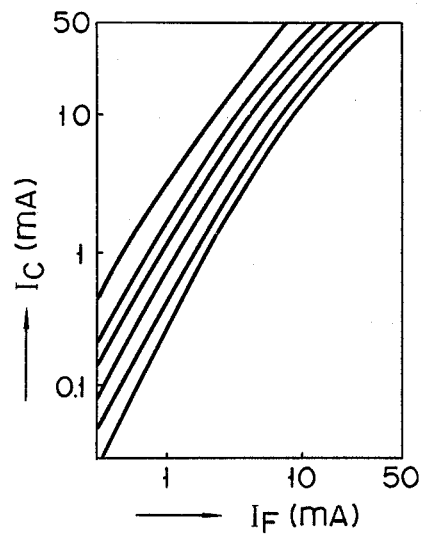
FIGS. 2A, 2B and 2C illustrate input/output current characteristic curves of the photo couplers, respectively.
Figure 2B:
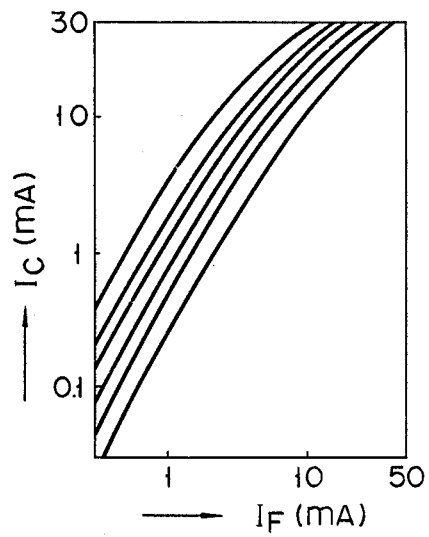
Figure 2C:
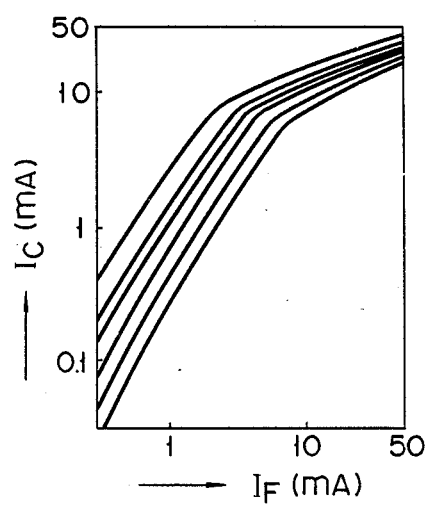
Figure 4:
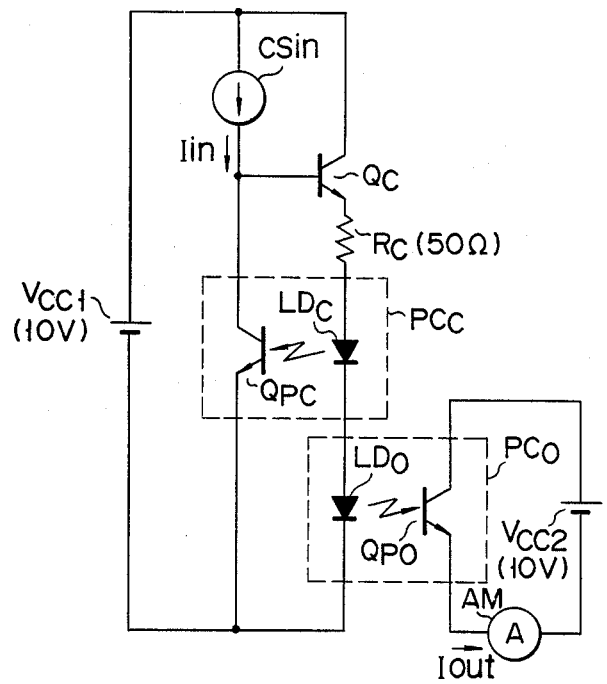
FIG. 4 is a circuit diagram of an experimental circuit for the FIG. 3 circuit.

An experimental circuit was prepared for experimentally confirming the characteristics of the current source circuit of FIG. 3. In the experimental circuit of FIG. 4, the NPN transistor $Q_C$ was 2SC372, the photo couplers $PC_C$ and $PC_O$ were TLP504A, and the resistance of the resistor $R_C$ was 50 ohms. A first power source $V_{CC}$ of 10 V was connected between $+V_C$ and $-V_E$. A second power source $V_{CC2}$ of 10 V, together with ammeter AM, was connected between the collector and the emitter of a photo transistor $Q_{PO}$. In this experimental circuit, a photo transistor $Q_{PC}$ is used in place of the combination of the photo diode $PD_C$ and the transistor $Q_{AC}$ in the control photo coupler $PC_C$. The photo transistor $Q_{PO}$ is used for combining the photo diode $PD_O$ and the NPN transistor $Q_{AO}$ in the output photo coupler $PC_O$. An input/output current characteristic of this circuit when the input current Iin is changed from 0.1 mA to 50 mA, is plotted with a continuous line in FIG. 5. The ideal input/output current characteristic for one of the current transfer ratio $\Gamma$ is indicated by a dotted line. As seen from FIG. 5, the characteristic of the FIG. 4 circuit is approximately that of the ideal one, and a substantial linearity is gained over a range from 0.1 mA to 50 mA. The characteristic curve shown in FIG. 5 proves that the equation (11), indicating that the smaller the input current Iin, the larger the error of the output current Iout, is true.

In the above embodiment, the primary side of a couple of photo couplers $PC_C$ and $PC_O$ are interconnected in series, so that the input and output currents are in one-to-one correspondence. It should be understood that the present invention is not limited to such an arrangement.

2. Second Embodiment of the Current Source Circuit

Figure 6:
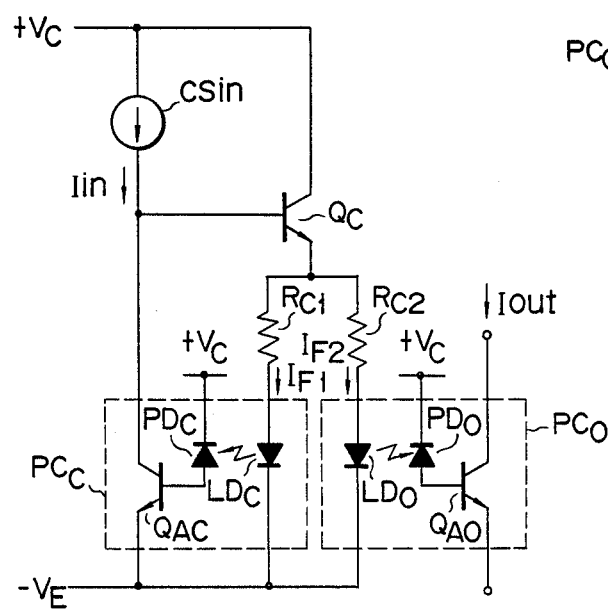

FIG. 6 shows a second embodiment of a current source circuit according to the present invention. The light-emitting diodes $LD_C$ and $LD_O$ in the control photo coupler $PC_C$ and the output photo coupler $PC_O$ are connected in parallel between the emitter of the NPN transistor $Q_C$ and $+V_E$. The light-emitting diode $LD_C$ and the light-emitting diode $LD_O$ are connected to the emitter of the NPN transistor $Q_C$ through the resistors $R_{C1}$ and $R_{C2}$ which prevent an overcurrent. The remaining circuit arrangement is substantially equal to that of the first embodiment of FIG. 3, and no further explanation thereof will be given. In this circuit, if the forward voltage drops $V_{F1}$ and $V_{F2}$ of the light-emitting diodes $LD_C$ and $LD_O$ are equal to each other, $$\frac{I_{F2}}{I_{F1}} = \frac{R1}{R2} \tag{12}$$

In the equation (12), $R_{C1}$ and $R_{C2}$ are the resistances of the resistors $R_{C1}$ and $R_{C2}$, respectively. If both the resistances are equal to each other, $$R_{C1} = R_{C2} \tag{13}$$

then we have:

$$I_{F1} = I_{F2} \tag{14}$$

This indicates that the second embodiment operates like the first embodiment. If the FIG. 6 circuit operates under the condition that n1=n2=1 in the formulae (2) and (3), the ratio of the input current Iin and the output current Iout may be determined by the current ratio $I_{F2}/I_{F1}$ of the equation (12), i.e. the resistance ratio, $R_{C1}/R_{C2}$.

3. Third Embodiment of the Current Source Circuit

Figure 7:
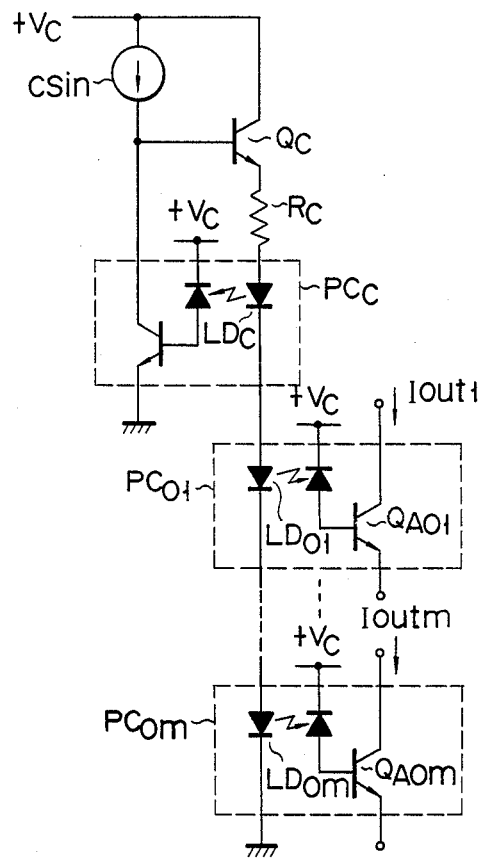
FIGS. 6, 7, 8 and 9 are circuit diagrams of current source circuits of other embodiments according to the present invention.

Turning now to FIG. 7, there is shown a third embodiment of a current source circuit according to the present invention. This embodiment contains three or more photo couplers $PC_C$, $PC_{O1}$, ..., $PC_{Om}$ in which light-emitting diodes $LD_C$, $LD_{O1}$, ..., $LD_{Om}$ are connected in series in the input side, and a plurality of output currents are produced. The control photo coupler $PC_C$ serves as a control photo coupler, and the remaining ones serve as output photo couplers. The output paths of those output photo couplers, i.e. the collector/emitter paths of the NPN transistors $Q_{AO1}$, ..., $Q_{AOm}$, are independent from one another and provide output currents Iout1, ..., Ioutm, respectively.

In this example, the output current Iouti (i=1, ..., m) of the output photo couplers $PC_{O1}$, ..., $PC_{Om}$ is given as:

$$Iouti = Ki \left( \frac{Iin}{K1} \right)^{\frac{ni}{n1}} \tag{15}$$

This formula indicates that each output current is determined by the parameter ratio of (K1, n1) and (Ki, ni).

4. Fourth Embodiment of the Current Source Circuit

Figure 8:
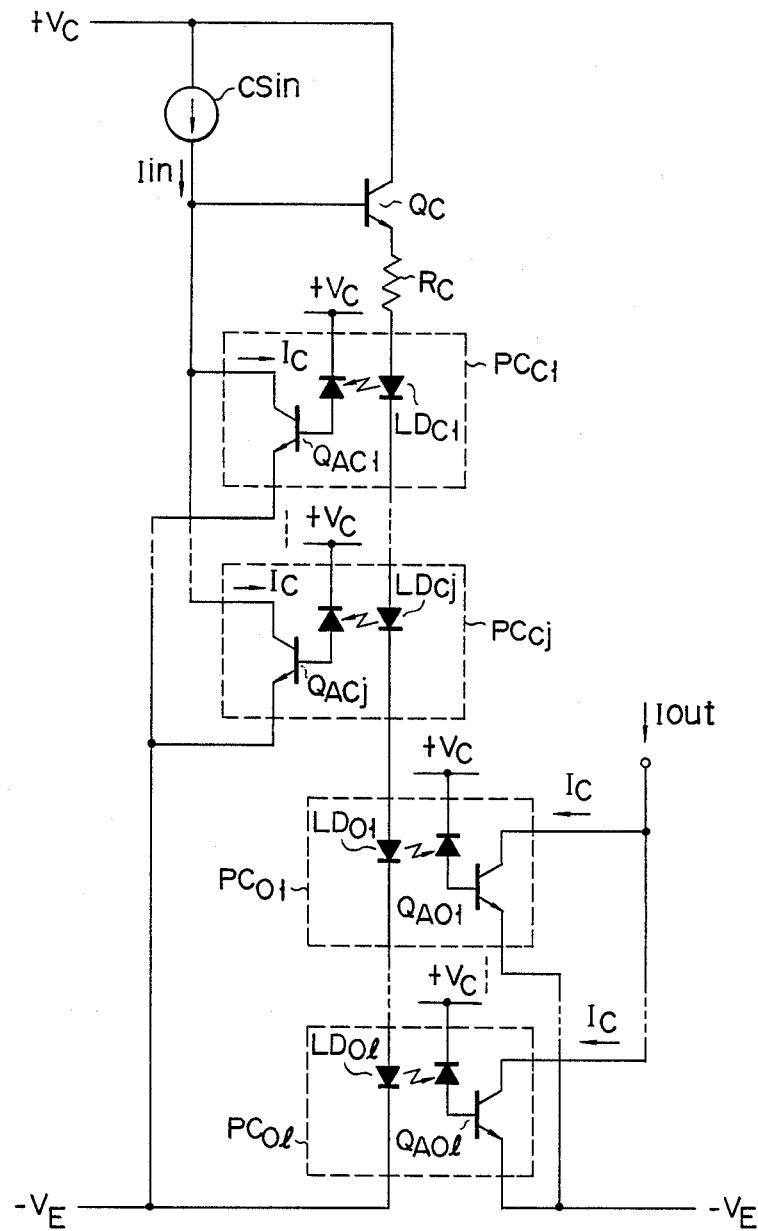

FIG. 8 shows a fourth embodiment of a current source circuit according to the present invention. The embodiment can obtain a desired current transfer ratio. As shown, j photo couplers $PC_{C1}$, ..., $PC_{Cj}$ are provided in the input current source circuit CSin, while l photo couplers $PC_{O1}$, ..., $PC_{Ol}$ are in the output side. Light-emitting diodes $LD_{C1}$-$LD_{Cj}$ and $LD_{O1}$-$LD_{Ol}$ in the input sides of the photo couplers $PC_{C1}$-$PC_{Cj}$ and $PC_{O1}$-$PC_{Ol}$ are connected in series to one another. The outputs of the control photo couplers $PC_{C1}$-$PC_{Cj}$, i.e. the collector/emitter paths of the transistor $Q_{AC1}$-$Q_{ACj}$, are connected in parallel between the base of the NPN transistor $Q_C$ and $-V_E$. The output of the output photo couplers $PC_{O1}$-$PC_{Ol}$, i.e. the collector/emitter paths of the transistors $Q_{AO1}$-$Q_{AOl}$, are connected in parallel to each other. The output current Iout is taken from this parallel connection paths. As described above, the input of the control and the output photo couplers are connected in series. Accordingly, the output currents Ic of those photo couplers are equal to one another. The relationships of the output current Ic to the input current Iin and to the output current Iout are given by:

$$Iin = jIc \tag{16}$$

$$Iout = lIc \tag{17}$$

The current transfer ratio $\Gamma$ is given by:

$$\Gamma = \frac{Iout}{Iin} = \frac{l}{j} \tag{18}$$

The equation (18) teaches that the current transfer ratio $\Gamma$ is determined by the ratio of the number j of the control photo couplers and the number l of the output photo couplers. Accordingly, a desired current transfer ratio can be set at a desired value.

5. Fifth Embodiment of the Current Source Circuit

Figure 9:
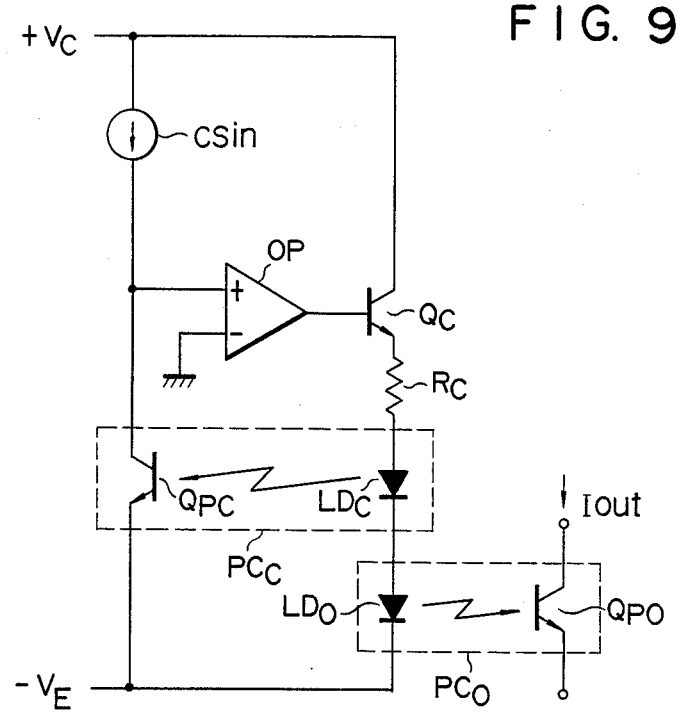

A fifth embodiment of a current source circuit according to the present invention as shown in FIG. 9 features the provision of an operational amplifier OP which is connected at the output terminal to the base of the current control transistor $Q_C$. The operational amplifier OP is grounded at the inverting input terminal (−) and is connected at the non-inverting input terminal (+) to the input current source circuit CSin. The combination of the photo diode $PD_C$ and the NPN transistor $Q_{AC}$, and the combination of the photo diode $PD_O$ and the transistor $Q_{AO}$ are respectively substituted for photo transistors $Q_{PC}$ and $Q_{PO}$.

This arrangement operates in the manner that the potential at the non-inverting input terminal (+) of the operational amplifier OP is made to approach the ground potential. When a resistor having a resistance $R_S$ is used for the input current source circuit CSin, the current value Iin of the input current source circuit CSin is simply given by the ratio $V_C/R_X$. This indicates that controlling the circuit operation is easy.

Figure 10:
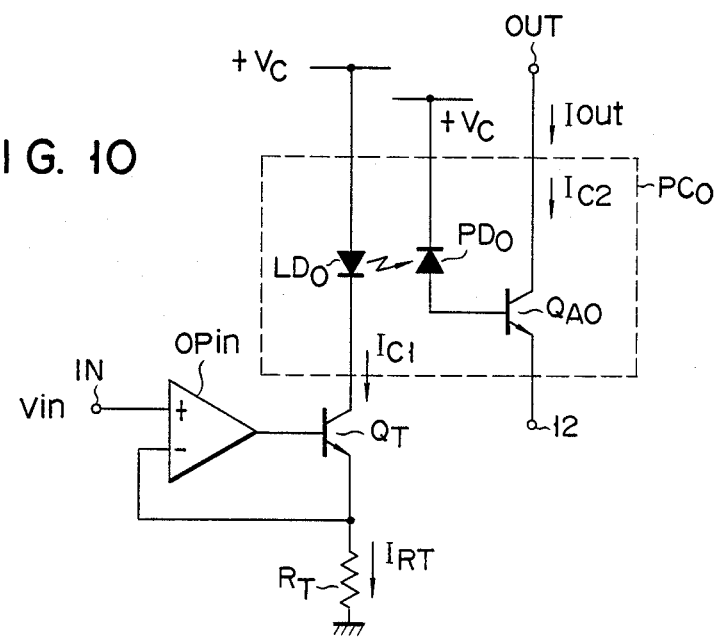
FIG. 10 is a circuit diagram of a voltage/current converting circuit incorporating the present invention.

FIG. 10 shows a voltage/current converting circuit in which a circuit with photo couplers according to the present invention is incorporated. An input circuit made up of an operational amplifier OPin is coupled at the non-inverting input terminal (+) with the input voltage Vin via the circuit input terminal IN. The output terminal of the operational amplifier OPin is connected to the base of a current/voltage converting NPN transistor $Q_T$ in an emitter follower fashion in which the emitter is grounded through a resistor $R_T$ for voltage/current conversion. The emitter of the transistor $Q_T$ is also connected to the inverting input terminal (−) of the operational amplifier OPin. The collector of the transistor $Q_T$ is connected to the power source potential $+V_C$ through a light-emitting diode $LD_O$ in the output photo coupler $PC_O$. The light-emitting diode $LD_O$ is connected at the anode to the power source potential $+V_C$ and at the cathode to the collector of the transistor $Q_T$. The light/electric converting circuit of the output photo coupler $PC_O$ is comprised of a photo diode $PD_O$ and an NPN transistor $Q_{AO}$ for amplifying the current. The cathode of the photo diode $PD_O$ is connected to the power source potential $+V_C$ and its anode is connected to the base on the NPN transistor $Q_{AO}$. For simplicity of illustration, the emitter of the NPN transistor $Q_{AO}$ is connected to the terminal 12. Its collector is connected to the output terminal OUT. The output current Iout flows into the collector/emitter path of the NPN transistor $Q_{AO}$. Actually, however, the emitter of the NPN transistor $Q_{AO}$ is grounded, for example, and its collector is connected to a proper power source via a proper load. Through this load, the output current Iout flows into the collector/emitter path of the NPN transistor $Q_{AO}$.

Using the above circuit arrangement, the emitter of the transistor $Q_T$ is connected to the inverting input terminal (−) of the operational amplifier OPin. Therefore, the emitter potential is substantially equal to the input voltage Vin. Additionally, the input impedance of the operational amplifier OPin is very large. Therefore, an extremely small or negligible current flows into the circuit input terminal IN. The emitter current of the transistor $Q_T$ is equal to the current $I_{RT}$ flowing through the resistor $R_T$. Hence, the collector current Ic1 of the transistor $Q_T$ is:

$$Ic1 = \frac{\alpha}{R_T}(Vin + Vos) \quad (19)$$

where $R_T$ is the resistance of the resistor $R_T$, $\alpha$ is the common base current amplification factor, and Vos is the offset voltage of the operational amplifier OPin. If the FIG. 10 circuit is ideal, $\alpha = 1$, Vos=0, and the collector current Ic1 is:

$$Ic1 = Vin/R_T \quad \ldots (20)$$

The collector current Ic1 is proportional to the input voltage Vin.

When considering only the output photo coupler $PC_O$ in the FIG. 10 circuit, the collector current of the NPN transistor $Q_{AO}$ is given by:

$$Ic2 = K\left(\frac{I_F}{I_{FO}}\right)^n \quad (21)$$

In the above equation, $I_F$ is the input current to the light-emitting diode $LD_O$ as an electric/photo converting element; K is the factor of proportionality; $I_{FO}$ is the input current (reference input current) to the light-emitting diode $LD_O$ when the factor K is measured; and the index n indicates the inclination of the $I_F$–Icp characteristic when it is plotted in a logarithmic graph.

Figure 11:
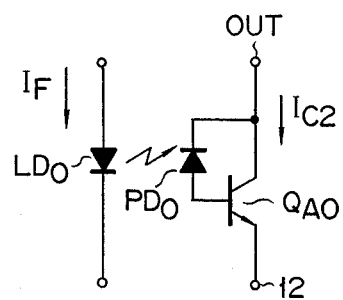
FIG. 11 shows a circuit diagram of part of the circuit diagram of FIG. 10.

Since the FIG. 11 circuit is an ideal circuit, n=1 and $K/I_{FO}=1$. Then, we have:

$$Ic2 = I_F \quad \ldots (22)$$

This indicates that a collector current Ic2 equal to the input current $I_F$ flowing into the light-emitting diode $LD_O$ appears at the output terminal OUT of the output photo coupler $PC_O$. In such a case, the output current Iout in the FIG. 10 circuit is:

$$Iout = Ic2 = \frac{Vin}{R_T} \quad (23)$$

This equation implies that an output current Iout proportional to the input voltage Vin appears at the output terminal OUT.

In the FIG. 10 circuit, the photo/electric converting circuit as an output system is electrically disconnected from the electric/photo converting circuit as an input system. This feature allows the potential of the output current to be set at any desired value.

Figure 12:
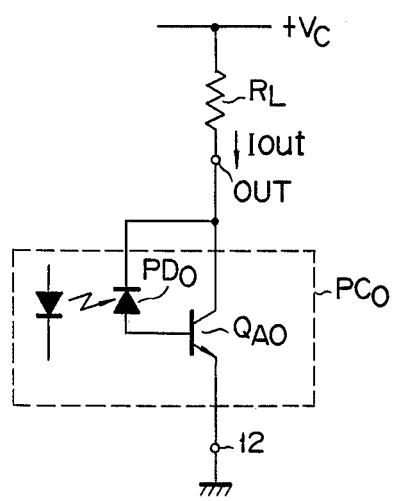
FIGS. 12 and 13 are circuit diagrams when the circuit of FIG. 11 is modified so that an output current can be taken out.
Figure 13:
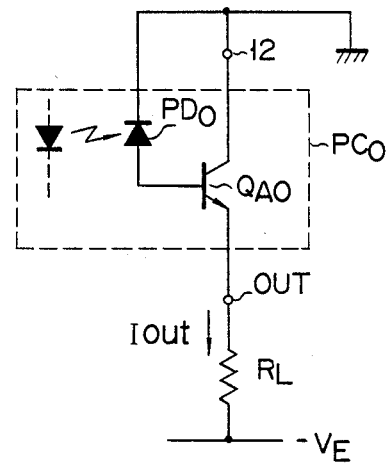

Circuits shown in FIGS. 12 and 13 are respectively the photo couplers shown in FIGS. 10 and 11 which have been modified so as to actually produce the output current Iout (Ic2). In FIG. 12, the collector of the transistor $Q_{AO}$ is connected to the power source potential $+V_C$ through a load resistor $R_L$, and its emitter is grounded. In the FIG. 13 circuit, the collector of the transistor $Q_{AO}$ is grounded and its emitter is connected to $-V_E$ via the load resistor $R_L$.

In the FIG. 12 circuit, the output current Iout flows from $+V_C$ to ground. In the FIG. 13 circuit, the current is directed from the ground to $-V_E$. In both the circuits of FIGS. 12 and 13, the polarities of the output current Iout are opposite to each other.

Figure 14:
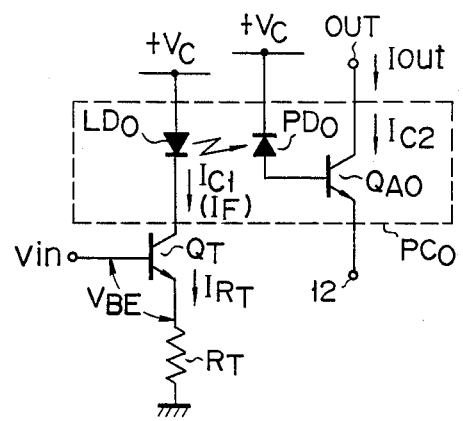
FIG. 14 is a circuit diagram when the circuit of FIG. 10 is simplified.

FIG. 14 is a modification of the voltage/current converting circuit of FIG. 10. In this circuit, the operational amplifier OPin, which is used in the FIG. 10 circuit, is omitted for simplifying the circuit construction. The input voltage Vin is applied to the base of the transistor $Q_T$. In this circuit, the emitter potential of the transistor $Q_T$ for converting the voltage/current is Vin$-V_{BE}$ where $V_{Be}$ is the voltage between the base and the emitter of the transistor $Q_T$. Accordingly, the collector current Ic1 of the transistor $Q_T$ is:

$$Ic1 = \frac{\alpha}{R_T}(Vin - V_{BE}) \quad (24)$$

If the voltage $V_{BE}$ is much smaller than the input voltage Vin, and the common current amplification factor $\alpha$ is "1" or approximately "1", the equation (24) is rewritten as:

$$Ic1 = \frac{Vin}{R_T} \qquad (25)$$

The above equation (25) is the same as the equation (20). Of all the voltage/current converting circuits according to the present invention, this circuit has the simplest construction. The input circuit connected to the base of the transistor $Q_T$ may be flexibly designed according to its application. For example, it may be an operational amplifier as in the FIG. 10 embodiment. Alternately, no operational amplifier is used and the input voltage Vin can be applied to the base of the transistor $Q_T$, as in the FIG. 14 embodiment.

Figure 15:
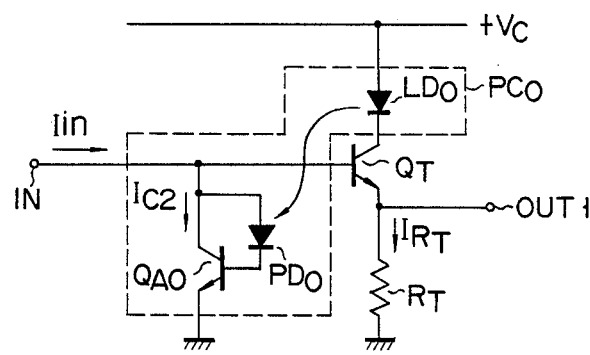
FIGS. 15 and 16 are circuit diagrams when the voltage/current converting circuit shown in FIG. 10 is modified so as to have an impedance converting function.

FIG. 15 is a modification of the voltage/current converting circuit shown in FIG. 14. This modification has an impedance converting function. In the circuit, the emitter of the NPN transistor $Q_{AO}$ is grounded, and the collector of the NPN transistor $Q_{AO}$ (the circuit output OUT in the FIG. 14 circuit) is connected to the base of the transistor $Q_T$ (i.e. the circuit input terminal IN).

In the output photo coupler $PC_O$ of the FIG. 14 circuit where $n \approx 1$ and $K \neq 1$ in the equation (21), the current Ic2, as the output current Iout which flows into the collector of the PNP transistor $Q_{AO}$ in the output system, is:

$$Ic2 = KI_F$$

When the electric current flowing through the resistor $R_T$ is denoted by $I_{RT}$ and the base current through the transistor $Q_T$ is negligible, the current Ic2 is:

$$Ic2 = KI_{RT}$$

In the circuit of FIG. 15, the emitter current $I_{RC}$ of the transistor $Q_T$ is Vin/$R_T$, and the current Iin flowing into the circuit input terminal IN is approximately equal to the collector current Ic2 of the NPN transistor $Q_{AO}$ in the output photo coupler $PC_O$. Then, we have:

$$Iin \approx KI_{RT} = \frac{KVin}{R_T}$$

When the output terminal OUT in the FIG. 14 circuit is connected to the base of the transistor $Q_T$, i.e. the circuit input terminal IN, and the current flowing into the output terminal is fed back to the circuit input terminal IN, and when the emitter of the transistor $Q_T$ is used as the output terminal OUT, the input impedance Zin of the FIG. 15 circuit is:

$$Zin = \frac{Vin}{Iin} = \frac{R_T}{K} \qquad (25)$$

As seen from the equation (25), the input impedance Zin depends on the resistance of the resistor $R_T$ and the factor K of proportionality of the output photo coupler $PC_O$.

Figure 16:
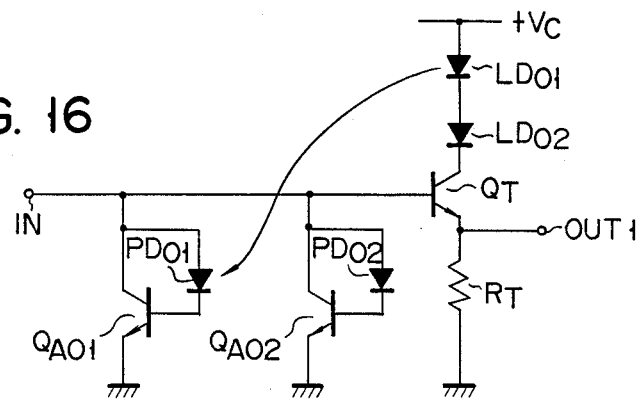

FIG. 16 illustrates a modification of the FIG. 15 circuit in which an additional photo coupler is used. As shown, a couple of light-emitting diodes $LD_{O1}$ and $LD_{O2}$ are provided between the collector of the transistor $Q_T$ and $+V_C$. A photo/electric converting circuit composed of a photo diode $PD_{O1}$ and an NPN transistor $Q_{AO1}$, and a photo/electric converting circuit composed of a photo diode $PD_{O2}$ and an NPN transistor $Q_{AO2}$ are provided in parallel between the input terminal and the ground. With such an arrangement, the collector current of the transistor $Q_T$ is fed back to the input terminal IN, by way of a couple of photo couplers. This circuit serves as an impedance converting circuit where the input impedance is $R_T/2K$ and the output impedance is $R_C$.

Figure 17:
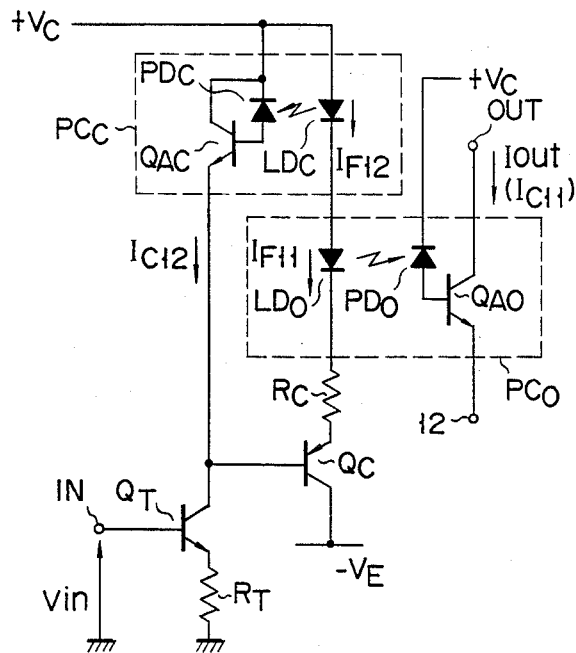
FIG. 17 is a circuit diagram of another embodiment of a voltage/current converting circuit according to the present invention.

In the circuits of FIGS. 10 to 16, the characteristic of the photo coupler is substantially linear and ideal. Actually, however, the characteristic of the photo coupler is nonlinear. Specifically, the index n in the equation (2) is approximately 2 in the region where the input current $I_F$ is small, usually less than 5 mA. The index n is about 1 in the region where the input current $I_F$ is large, usually 10 mA. The FIG. 17 circuit corresponds to the voltage/current converting circuit of FIG. 13 which is modified so as to have a nonlinear compensating function. In FIG. 17, a couple of photo couplers with the same characteristics are used in order to compensate for the nonlinearity.

In the FIG. 17 circuit, the collector of the transistor $Q_T$ is connected to $+V_C$ through the photo/electric converting circuit of the current control photo coupler $PC_C$, i.e. a circuit composed of the photo diode $PD_C$ and the NPN transistor $Q_{AC}$. The same collector is connected to the base of the NPN transistor $Q_C$. The emitter of the transistor $Q_T$ is grounded through the resistor $R_T$. The input votage Vin is applied to the base of the transistor $Q_T$, through the circuit input terminal IN. The collector of the transistor $Q_C$ is connected to $-V_E$, and its emitter is connected to $+V_C$ via the resistor $R_C$, the light-emitting diode $LD_O$ in the output photo coupler $PC_O$, and the light-emitting diode $LD_C$ of the control photo coupler $PC_C$. The output current Iout is taken out from the output circuit composed of the photo diode $PD_O$ and the transistor $Q_{AO}$ which is contained in the photo/electric converting circuit of the output photo coupler $PC_O$.

In the FIG. 17 circuit, a circuit block containing the control photo coupler $PC_C$ and the NPN transistor $Q_C$ forms a nonlinear compensating circuit which compensates for the nonlinearity of the output photo coupler $PC_O$. This compensating circuit forms a feedback loop, and operates to make the output current Iout of the output photo coupler $PC_O$ equal to the current flowing through the collector/emitter path of the NPN transistor $Q_{AC}$. It is assumed that the factors of proportionality and the indices are K11 and K12, and n11 and n12, respectively in the photo couplers $PC_O$ and $PC_C$ when the reference current $I_{FO}$ is fed into the light-emitting diodes $LD_O$ and $LD_C$ in those photo couplers. The currents Ic11 and Ic12 flowing through the output transistors $Q_{AO}$ and $Q_{AC}$ in the photo couplers $PC_O$ and $PC_C$ are:

$$Ic11 = K11 \left( \frac{I_{F11}}{I_{FO}} \right)^{n11} \qquad (26)$$

$$Ic12 = K12 \left( \frac{I_{F12}}{I_{FO}} \right)^{n12}$$

In the above equations, $I_{F11}$ and $I_{F12}$, respectively, are currents flowing into the electric/photo converting elements $LD_C$ and $LD_O$. These currents are equal to each other and then become:

$$I_{F11} = I_{F12} \qquad \ldots (27)$$

Rearranging the equations (26) under this condition, we have:

$$Ic11 = K11 \left(\frac{Ic12}{K12}\right)^{\frac{n11}{n12}} \quad (28)$$

Further, $$Ic12 = Vin/R_T$$

$$Ic11 = Iout \quad \ldots (29)$$

If the photo couplers $PC_O$ and $PC_C$ have substantially equal characteristics, n11=n12 and K11=K12, the equation (28) is rewritten into:

$$Ic11 = Ic12$$

Therefore, the output current Iout is as follows:

$$Iout = Vin/R_T \quad \ldots (30)$$

As seen from the equation (30), the FIG. 17 circuit can produce an output current Iout proportional to the input voltage Vin, independently of the characteristics of the photo couplers $PC_O$ and $PC_C$.

Figure 18:
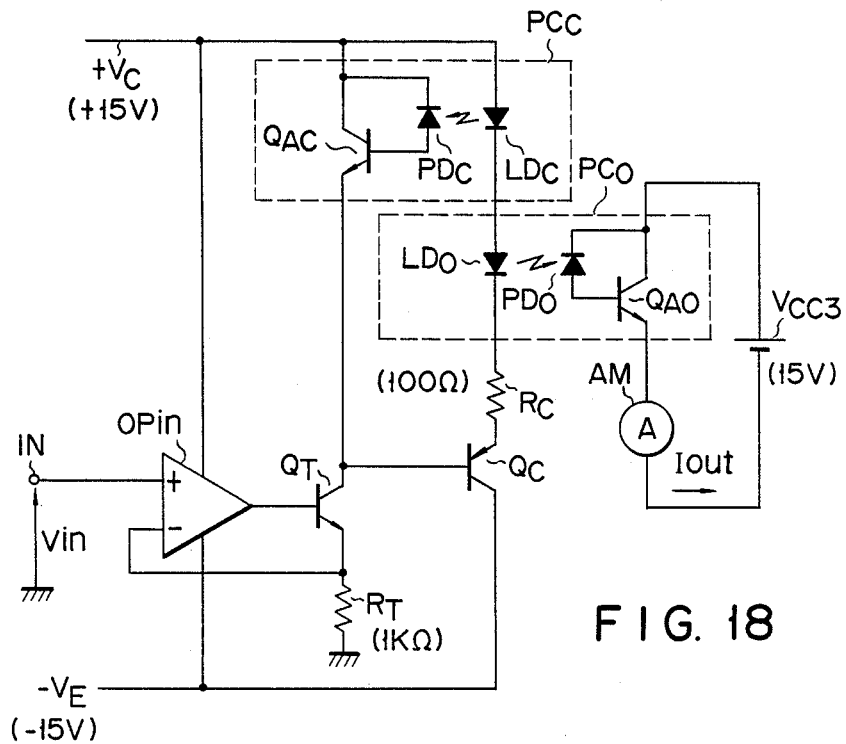
FIG. 18 is a circuit diagram of an experimental circuit of the circuit of FIG. 17.

FIG. 18 shows an experimental circuit of the FIG. 17 circuit. TLP521-2 having a couple of photo couplers sealed in a single package was used for the photo couplers $PC_O$ and $PC_C$. 2SC372 was used for the transistor $Q_T$; 2SA495 was used for the NPN transistor $Q_C$; and TA7504 was used for the operational amplifier OPin as the input circuit. The resistance of the resistors $R_T$ and $R_C$ was 1 kilo ohms and 100 ohms, respectively. The output transistor $Q_{AO}$ of the photo coupler $PC_O$ is connected to a second power source voltage $V_{CC3}$, via an ammeter AM. $+V_C$ and $-V_E$ were $+15$ V and $-15$ V, respectively.

Figure 19:
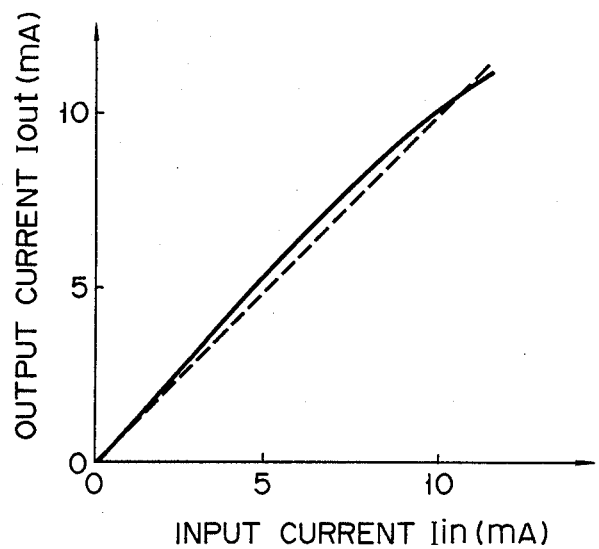
FIG. 19 is an input/output current characteristic curve of the experimental circuit of FIG. 18.

In the graph of FIG. 19, the continuous line indicates the input/output current characteristic plotted when the input voltage Vin is changed from 0 V to 10 V. The dotted line indicates the ideal characteristic curve. A maximum error within the measuring range was approximately 8% in the vicinity of Vin=5 V. This value indicates that the nonlinearity of the photo coupler is substantially corrected in the FIG. 17 circuit.

Figure 20:
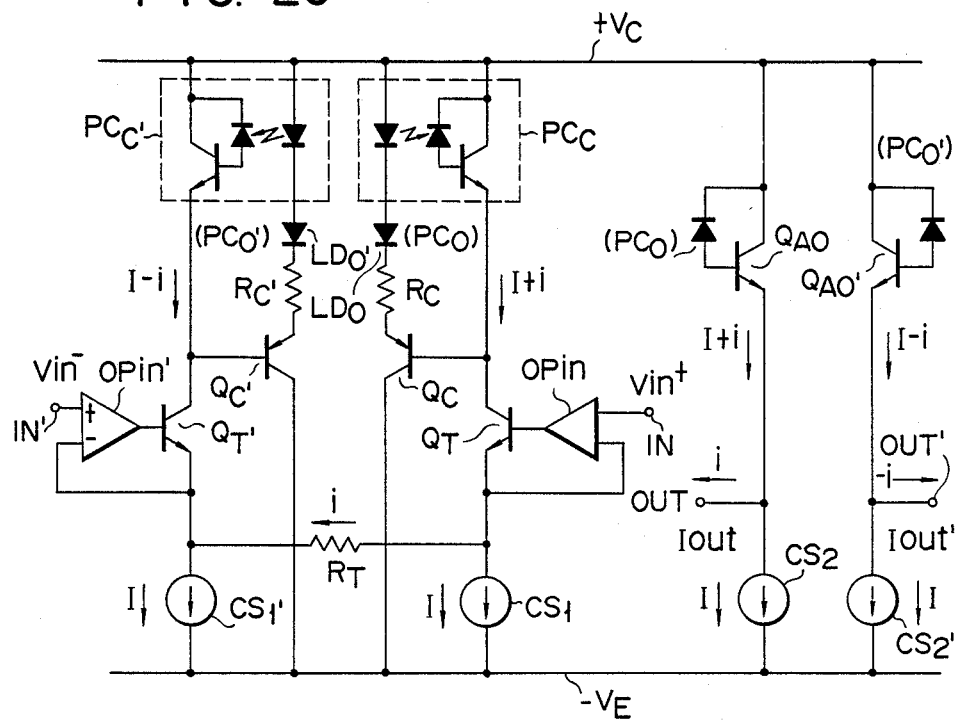
FIG. 20 is a circuit diagram of a voltage/current converting circuit which is a further embodiment of the present invention.

Turning now to FIG. 20, there is shown another voltage/current converting circuit. In FIG. 20, a couple of the FIG. 17 circuits are connected in a symmetrical manner. In response to a differential input voltage ΔVin, this circuit produces output currents +i and −i. In both the voltage/curent converting systems in this circuit, like portions are designated by like numbers, but only one system uses primed numbers. Since these systems operate in exactly the same manner, only one of them will be described.

An operational amplifier OPin (OPin') is provided as an input circuit in the voltage/current converting system. Voltage Vin+ (Vin−) is applied through a circuit input terminal IN (IN') to the non-inverting input terminal (+) of the operational amplifier OPin (OPin'). The inverting input terminal (−) of the operational amplifier OPin (OPin') is connected to the emitter of the transistor $Q_T$ ($Q_T'$). The output terminal of the operational amplifier Opin (Opin') is connected to the base of the transistor $Q_T$ ($Q_T'$). A constant current source CS1 (CS1') feeding a current value I is connected between the emitter of the transistor $Q_T$ ($Q_T'$) and the negative power voltage $-V_E$. Another constant current source CS2 (CS2') for feeding the current I is provided between the transistor $Q_{AO}$ ($Q_{AO}'$) and $-V_E$. A resistor $R_T$ for converting the voltage/current is provided between the emitters of the transistors $Q_T$ and $Q_T'$. A photo coupler $PC_C$ ($PC_C'$), a transistor $Q_C$ ($Q_C'$) for controlling the current, and a resistor $R_C(R_C')$ for limiting the current cooperate to form a circuit for compensating the nonlinearity of the output photo coupler $PC_O$ ($PC_O'$).

The circuit output current Iout (Iout') is taken out from the emitter of the transistor $Q_{AO}$ ($Q_{AO}'$) through the output terminal OUT (OUT'). Voltages Vin+ and Vin− are differentially applied to the non-inverting input terminals of the operational amplifiers OPin and OPin', respectively. Therefore, the potentials at the inverting input terminals (−) of the operational amplifiers OPin and OPin' become respectively equal to Vin+ and Vin−. Accordingly, current i as described later flows into the resistor $R_T$ to convert the voltage/current.

Current (I+i) ((I−i)), where I is the current of the constant current source CS1 (CS1'), flows through the collector of the transistor $Q_T$ ($Q_T'$). The current (I+i) ((I−i)) is transferred to the collector/emitter path of the transistor $Q_{AO}$ ($Q_{AO}'$) through the electric/photo converting circuit and the photo/electric converting circuit in the photo couplers $PC_C$ and $PC_O$ ($PC_C'$ and $PC_O'$).

The current (I+i) flows into the output terminal OUT and into the side of the constant current source CS2 in a shunting manner. Current +i is output from the output terminal OUT. Similarly, the current (I−i) flows into the output terminal OUT' and into the constant current circuit CS2'. The circuit output current −i is output from the output terminal OUT'. In this way, two currents +i and −i are produced having opposite polarities in the FIG. 20 circuit.

As seen from the foregoing description, according to the present invention, there are provided many types of circuits; a current source circuit in which the input and output currents are proportionally related to each other; a current source circuit providing different polarity currents; a voltage/current converting circuit in which the input and output are proportionally related each other; a voltage/current converting circuit in which the polarity of the output current can be desirably selected.

What is claimed is:

1. A voltage/current converter comprising:
    an amplifier, having an inverting input terminal and a non-inverting input terminal, said non-inverting input terminal being supplied with an input voltage;
    a voltage/current converting circuit including a transistor, having an emitter, a base, and a collector, said emitter and said base being connected to said inverting input terminal and to an output terminal of said amplifier, respectively, and a resistor, inserted between the emitter of said transistor and a reference potential, through which an electric current proportional to said input voltage passes;
    electric/photo converting means, inserted between a power source potential and the collector of said transistor, for converting said electric current passing through said resistor into an optical signal; and a photo/electric converting circuit for converting said optical signal into an electric current proportional to said electric current passing through said resistor.

2. A voltage/current converter comprising:

a voltage/current converting circuit including a transistor, having an emitter, a base and a collector, said base being supplied with an input voltage, and a resistor, inserted between said emitter of said transistor and a reference potential, through which an electric current proportional to said input voltage passes;

electric/photo converting means, inserted between a power source potential and said collector of said transistor, for converting said electric current passing through said resistor into an optical signal, said electric current flowing through said electric/photo converting means being reverse biased and proportional to said input voltage;

a photo/electric converting circuit for converting said optical signal of said electric/photo converting means into an electric current proportional to said electric current passing through said resistor; and circuit means for feeding said electric current converted by said photo/electric converting circuit back to said base of said transistor in said voltage/current converting circuit.

3. A voltage/current converter comprising:

a first voltage/current converting circuit including a first transistor, having an emitter, a base, and a collector, said base being supplied with an input voltage, and a first resistor, inserted between said emitter of said first transistor and a reference potential through which an electric current proportional to said input voltage passes;

a second voltage/current converting circuit including a second transistor, having an emitter, a base, and a collector, said base and said collector being connected to said collector of said first transistor and to a first power source potential, respectively, and a second resistor having one terminal connected to said emitter of said second transistor;

electric/photo converting means, inserted between a second power source potential and another terminal of said second resistor, for converting an electric current passing through said resistor into an optical signal;

first photo/electric converting means for converting said optical signal of said electric/photo converting means into an electric signal and for outputting the converted electric signal; and second photo/electric converting means, inserted between said second power source potential and said collector of said first transistor, for converting said optical signal of said electric/photo converting means into an electric signal, said second photo/electric converting means and said second voltage/current converting circuit forming circuit means for compensating for a non-linear output for said first photo/electric converting means.

4. A voltage/current converter comprising:

a first amplifier, having an inverting input terminal and a non-inverting input terminal, said inverting input terminal being supplied with a first input voltage of a first polarity;

a first voltage/current converting circuit includng a first transistor, having an emitter, a base, and a collector, said base being connected to an output terminal of said first amplifier, said emitter being connected to said inverting input terminal of said amplifier and to a first power source potential through a first current source, and a first resistor having one terminal connected to said emitter of said first transistor; a second voltage/current converting circuit including a second transistor, having an emitter, a base, and a collector, said base and said collector being connected to said collector of said first transistor and to said first power source potential, respectively, and a second resistor having one terminal connected to said emitter of said second transistor;

first electric/photo converting means, inserted between a second power source potential and another terminal of said second resistor, for converting an electric current passing through said second resistor into an optical signal;

first photo/electric converting means, inserted between said first and said second power source terminals, for converting said optical signal of said first electric/photo converting means into an electric signal and for outputting the converted electric signal;

second photo/electric converting means, inserted between said second power source potential and said collector of said first transistor, for converting said optical signal of said first electric/photo converting means into an electric signal, said second photo electric converting means and said second voltage/current converting means forming circuit means for compensating for a non-linear output of said first photo/electric converting means;

a second amplifier, having an inverting input terminal and a non-inverting input terminal, and non-inverting input terminal being supplied with a second input voltage of a polarity opposite to that of said first input voltage;

a third voltage/current converting circuit including a third transistor, having an emitter, a base, and a collector, said base being connected to an output terminal of said second amplifier, said emitter being connected to said inverting input terminal of said second amplifier, to said first power source potential through a second current source, and to another terminal of said first resistor;

a fourth voltage/current converting circuit including a fourth transistor, having an emitter, a base, and a collector, said base and said collector being connected to said collector of said third transistor and to said first power source potential, respectively, and a third resistor having one terminal connected to said emitter of said fourth transistor;

second electric/photo converting means, inserted between said second power source potential and another terminal of said third resistor, for converting an electric current passing through said third resistor into an optical signal;

third photo/electric converting means, inserted between said first and said second power source potentials, for converting said optical signal of said second electric/photo converting means into an electric signal and for outputting the converted electric signal; and fourth photo/electric converting means, inserted between said second power source potential and said collector of said third transistor, for converting said optical signal of said electric/photo converting means into an electric signal, said fourth photo/electric converting means and said fourth voltage/current means forming circuit means for compensating for a non-linear output of said second photo/electric converting means.

* * * * *

UNITED STATES PATENT AND TRADEMARK OFFICE
CERTIFICATE OF CORRECTION

PATENT NO. : 4,752,693
DATED : June 21, 1988
INVENTOR(S) : Katsumi NAGANO

It is certified that error appears in the above-identified patent and that said Letters Patent is hereby corrected as shown below:

Title Page, change assignees address from "Shimonoseki" to --Kawasaki-shi--.

Signed and Sealed this

First Day of August, 1989

Attest:

DONALD J. QUIGG

Attesting Officer

Commissioner of Patents and Trademarks